US 6,743,666 B1

(12) United States Patent
Chan

(10) Patent No.: US 6,743,666 B1
(45) Date of Patent: Jun. 1, 2004

(54) SELECTIVE THICKENING OF THE SOURCE-DRAIN AND GATE AREAS OF FIELD EFFECT TRANSISTORS

(75) Inventor: Simon Siu-Sing Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 111 days.

(21) Appl. No.: 10/134,981

(22) Filed: Apr. 29, 2002

Related U.S. Application Data
(60) Provisional application No. 60/286,941, filed on Apr. 27, 2001.

(51) Int. Cl.[7] .................. H01L 21/00; H01L 21/84; H01L 21/336
(52) U.S. Cl. .................. 438/151; 438/300; 438/303; 438/302
(58) Field of Search .................. 438/151, 702, 438/300, 303, 301, 302, 305, 621

(56) References Cited

U.S. PATENT DOCUMENTS

| | | | |
|---|---|---|---|
| 5,250,454 A | * | 10/1993 | Maszara .................. 438/151 |
| 5,384,281 A | * | 1/1995 | Kenney et al. .................. 438/702 |
| 5,565,383 A | | 10/1996 | Sakai |
| 5,637,518 A | | 6/1997 | Prall et al. |
| 5,739,573 A | * | 4/1998 | Kawaguchi .................. 438/302 |
| 5,824,586 A | | 10/1998 | Wollesen et al. |
| 5,970,352 A | | 10/1999 | Shiozawa et al. |
| 5,994,191 A | * | 11/1999 | Xiang et al. .................. 438/300 |
| 6,015,752 A | | 1/2000 | Xiang et al. |
| 6,051,473 A | | 4/2000 | Ishida et al. |
| 6,057,200 A | | 5/2000 | Prall et al. |
| 6,091,117 A | | 7/2000 | Shiozawa et al. |
| 6,121,090 A | * | 9/2000 | Wu .................. 438/275 |
| 6,147,402 A | * | 11/2000 | Joshi et al. .................. 257/751 |
| 6,200,871 B1 | * | 3/2001 | Moslehi .................. 438/303 |
| 6,222,267 B1 | * | 4/2001 | Omura .................. 438/621 |
| 6,284,612 B1 | * | 9/2001 | Wu .................. 438/305 |

OTHER PUBLICATIONS

Rossnagel, S.M., *Sputter Deposition for Semiconductor Manufacturing*, IBM Journal of Research & Development, vol. 43, No. 1/2—Plasma processing; 1999.

* cited by examiner

Primary Examiner—John F. Niebling
Assistant Examiner—Walter L. Lindsay, Jr.
(74) Attorney, Agent, or Firm—Renner, Otto, Boiselle & Sklar, LLP

(57) ABSTRACT

A method of making a semiconductor device includes thickening source and drain regions. After a field effect device having a source region, a drain region, and a gate, is formed, a layer of semiconductor material is deposited on the device by a directional deposition method, such as collimated sputtering. Then the semiconductor material is selectively removed from side walls on either side of the gate, such as by isotropic back etching, leaving thickened semiconductor material in the source and drain regions, and on the gate.

28 Claims, 6 Drawing Sheets

SELECTIVE THICKENING OF THE SOURCE-DRAIN AND GATE AREAS OF FIELD EFFECT TRANSISTORS

This application claims the benefit of U.S. Provisional Application No. 60/286,941, filed Apr. 27, 2001, which is hereby incorporated by reference.

BACKGROUND OF THE INVENTION

1. Technical Field

The present invention generally relates to a semiconductor device and methods for manufacturing the semiconductor device and, more particularly, to a field effect transistor having elevated source and drain regions and methods for manufacturing the same.

2. Description of the Related Art

The semiconductor industry is increasingly characterized by a growing trend toward fabricating larger and more complex circuits on a given semiconductor chip. This is being achieved by reducing the size of individual devices within the circuits and spacing the devices closer together. The reduction of the size of individual devices and the closer spacing brings about improved electrical performance.

As the physical dimensions of field effect devices are scaled down, the operating voltages are being scaled down accordingly in order not to have excessive internal electric fields. At low operating voltages, it is increasingly important to have small parasitic resistances at the source, drain and gate regions. This is usually achieved by forming a metal silicide in these regions and making contacts to the low resistivity metal silicide.

However, in field effect devices with very shallow junctions or in fully depleted semiconductor-on-insulator SOI devices, the silicon layer at the source and drains regions are insufficient for metal silicide formation. A previous method of addressing this problem has been to thicken the source and drain by epitaxial growth of semiconductor material. However, thickening by epitaxial growth involves high-temperature processes that may cause undesirable redistribution of dopants.

SUMMARY OF THE INVENTION

A method of making a semiconductor device includes thickening source and drain regions. After a field effect device having a source region, a drain region, and a gate, is formed, a layer of semiconductor material is deposited on the device by a directional deposition method, such as collimated sputtering. Then the semiconductor material is selectively removed from side walls on either side of the gate, such as by isotropic back etching, leaving thickened semiconductor material in the source and drain regions, and on the gate.

According to an aspect of the invention, a method of thickening a source and drain of a transistor device includes directionally depositing semiconductor material, and isotropically etching the semiconductor material.

According to another aspect of the invention, a method of making a semiconductor-on-insulator device includes the steps of forming a structure including a source region and a drain region in a surface semiconductor layer of the device, and a gate and a pair of spacers on the surface semiconductor layer, wherein the spacers on respective opposite sides of the gate, and wherein the gate is operatively coupled to the source region and the drain region; directionally depositing semiconductor material on the gate, the spacers, and on exposed portions of the source region and the drain region; and selectively removing the semiconductor material to uncover at least part of each of the spacers, the selectively removing leaving a source-side slab of the semiconductor material overlying the source, and a drain-side slab of the semiconductor material overlying the drain.

According to still another aspect of the invention, a method of making a semiconductor-on-insulator device includes the steps of a) forming a structure including a source region and a drain region in a surface semiconductor layer of the device, and a gate and a pair of spacers on the surface semiconductor layer, wherein the spacers on respective opposite sides of the gate, and wherein the gate is operatively coupled to the source region and the drain region, the forming including: i) forming a gate on the surface semiconductor layer; ii) forming a source extension and a drain extension on respective opposite sides of the gate; iii) forming the spacers on opposite sides of the gate; and iv) forming the source region and the drain region; b) directionally depositing semiconductor material on the gate, the spacers, and on exposed portions of the source region and the drain region; and c) selectively removing the semiconductor material to uncover at least part of each of the spacers, the selectively removing leaving a source-side slab of the semiconductor material overlying the source, a drain-side slab of the semiconductor material overlying the drain, and a gate slab of the semiconductor material at least partially overlying the gate.

According to a further aspect of the invention, a method of making a semiconductor-on-insulator device includes the steps of forming a structure including a source region and a drain region in a surface semiconductor layer of the device, and a gate and a pair of spacers on the surface semiconductor layer, wherein the spacers on respective opposite sides of the gate, and wherein the gate is operatively coupled to the source region and the drain region; collimated sputtering semiconductor material on the gate, the spacers, and on exposed portions of the source region and the drain region; isotropically etching the semiconductor material to uncover at least part of each of the spacers, the selectively removing leaving a source-side slab of the semiconductor material overlying the source, a drain-side slab of the semiconductor material overlying the drain, and a gate slab of the semiconductor material at least partially overlying the gate; depositing a metal layer; and annealing the device to induce formation of semiconductor-metal compound regions at intersections of the slabs and the metal layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A field effect device includes thickened source and drain regions formed by a highly directional deposition of semiconductor material, such as by collimated sputtering, followed by removal of the semiconductor material from the sidewalls of spacers on opposite sides of a gate, such as by isotropic etching. In addition to the thickened source and drain regions, the method may also cause widening of the gate at the top, resulting in reduced gate resistance.

This invention is described below in the context of a fully depleted SOI device, since such devices are expected to benefit from the invention the most. However, all aspects of the invention apply equally well to bulk field effect devices, which will also benefit when the source and drain junctions are too shallow to support silicidation.

Figure 1:
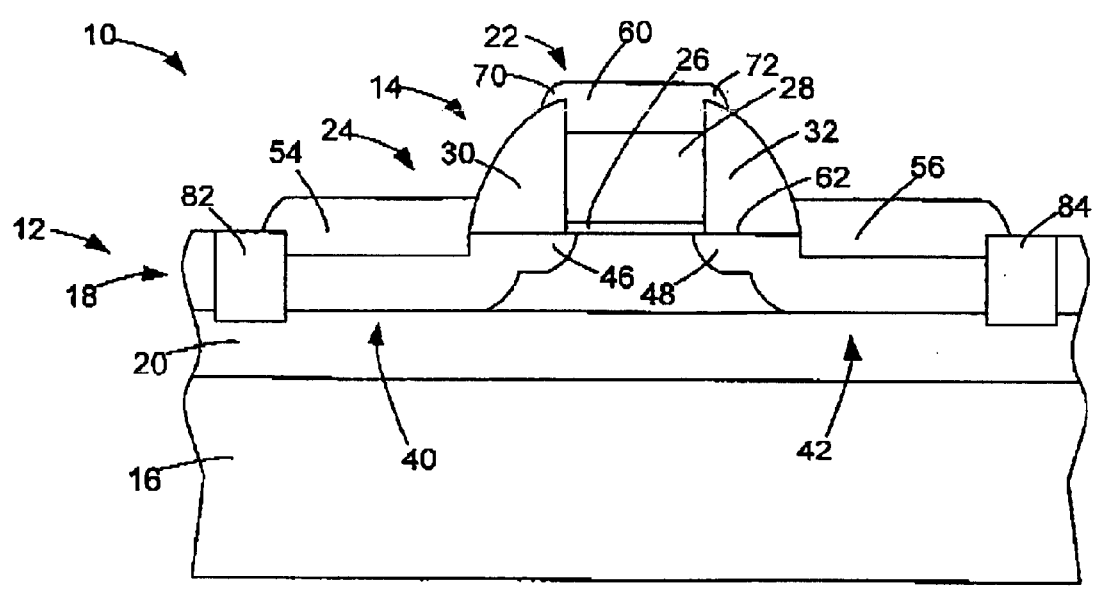
FIG. 1 is a cross-sectional view of a semiconductor device in accordance with the present invention.

Referring initially to FIG. 1, a semiconductor device 10 includes an SOI wafer 12 with a transistor 14 formed thereupon. The SOI wafer 12 includes a semiconductor substrate 16 and a surface semiconductor layer 18, with a buried insulator layer 20 therebetween. The semiconductor substrate 16 and the surface semiconductor layer 18 may be made of silicon, and the buried insulator layer 20 may be made of a silicon oxide such as $SiO_2$, although it will be appreciated that other suitable materials may be used instead or in addition.

The transistor 14 includes a gate 22 formed on an active semiconductor region 24 of the surface semiconductor layer 18. The gate 22 includes a gate dielectric 26 and a gate electrode 28. In addition, spacers 30 and 32 are on respective opposite sides of the gate 22. Exemplary materials for the gate dielectric 26 are $SiO_2$ and $Si_3N_4$. The gate electrode 28 may be made of polysilicon or another semiconductor, or may be made in whole or in part of metal. An exemplary material for the spacers 30 and 32 is SiN.

The active region 24 includes a body 38, with a source 40 (also referred to as "source region") and a drain 42 (also referred to as "drain region") on respective opposite sides of the body. The source 40 and the drain 42 have respective source and drain extensions 46 and 48. As is conventional, the body 38 is primarily of different conductivity semiconductor material than the source 40 and the drain 42. For instance, the body 38 may be P–conductivity silicon while the source 40 and the drain 42 may be N–conductivity silicon. Alternatively, the body 38 may be N–conductivity silicon while the source 40 and the drain 42 may be P–conductivity silicon.

The body 38, the source 40, and the drain 42, are operatively coupled with the gate 22 to function as a transistor. The source 40 and the drain 42 are covered by respective source and drain electrically-conducting metal-semiconductor compound regions 54 and 56 (also referred to as "silicide regions"), to facilitate electrical connection to the source and drain. The gate electrode 28 likewise may be include an upper gate region 60 with a metal-semiconductor compound to facilitate electrical connection.

The source and drain silicide regions 54 and 56 include portions that are elevated above a top surface 62 of the active region 24. The gate silicide region 60 includes overhangs 70 and 72 which overlie the spacers 30 and 32, respectively.

The metal semiconductor compounds may include compounds of titanium, cobalt, and/or tungsten, such as titanium suicide ($TiSi_2$) or cobalt silicide ($CoSi_2$). It will be appreciated that these are only examples, and that other suitable metal semiconductor compounds may alternatively be used.

The active region 24 is laterally isolated from other structures of the device 10 by insulator-filled trenches 82 and 84 on opposite sides of the active region. The insulator-filled trenches 82 and 84 may be trenches filled with silicon dioxide ($SiO_2$) using known isolation techniques.

Figure 2:
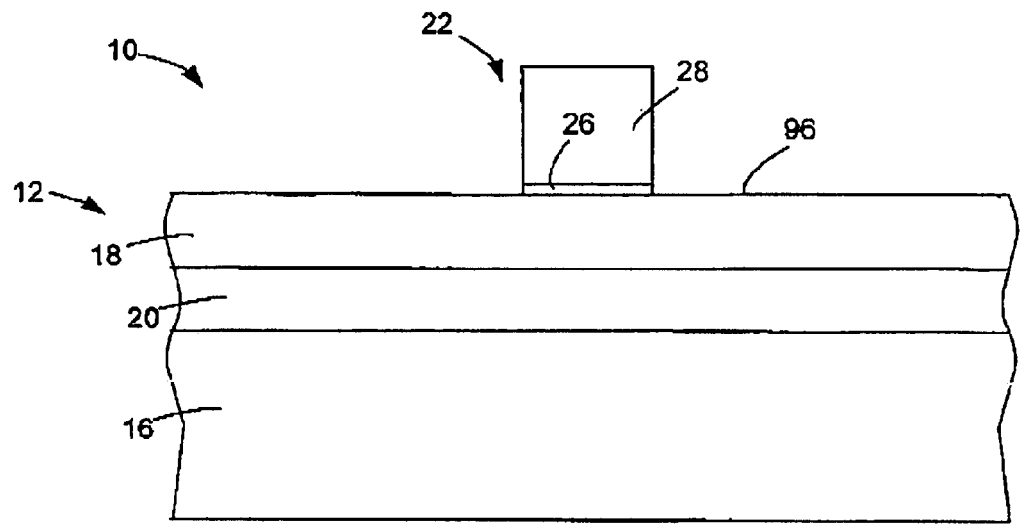
FIGS. 2–11 are cross-sectional views of various steps in a method of fabricating the semiconductor device of FIG. 1.
Figure 3:
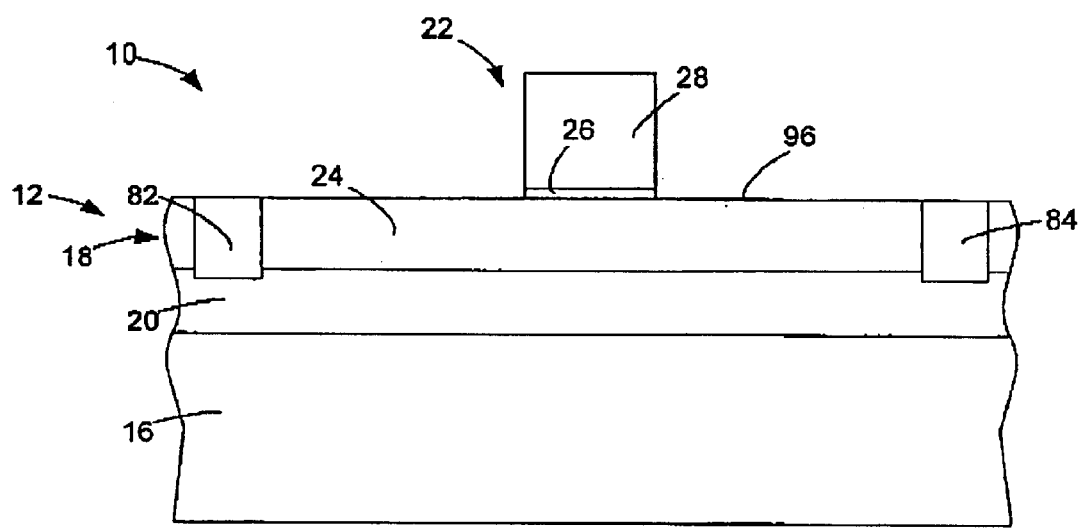

Various steps in the fabrication of the above-described semiconductor device 10 are illustrated in FIGS. 2–11. Referring initially to FIG. 2, starting initially with the SOI wafer 12, insulator-filled trenches 82 and 84 are created using well known techniques such as shallow trench isolation (STI) or local oxidation (LOCOS). Thereafter the gate 22 is formed as shown in FIG. 3. It will be appreciated that there are many well-known sources and methods for forming the gate 22. For example, a layer of dielectric material may be deposited on a wafer surface 96 of the SOI wafer 12, with a layer of semiconductor material then deposited thereupon. The layers may selectively be etched to form the gate dielectric 26 and the gate electrode 28. The gate electrode 28 may be made out of polysilicon which may be deposited using well-known processes such as low pressure chemical vapor deposition (LPCVD).

Figure 4:
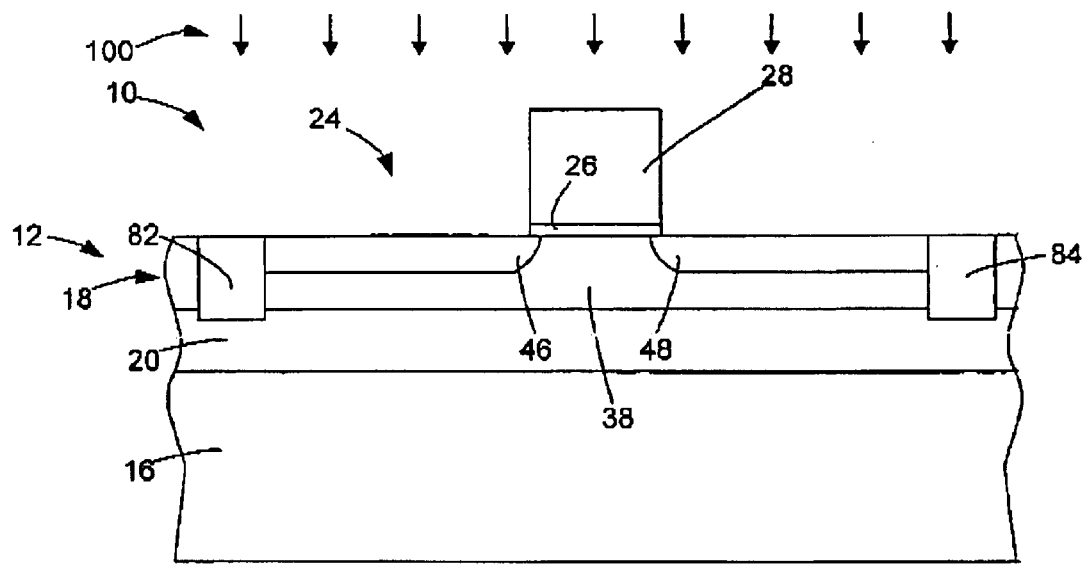
Figure 5:
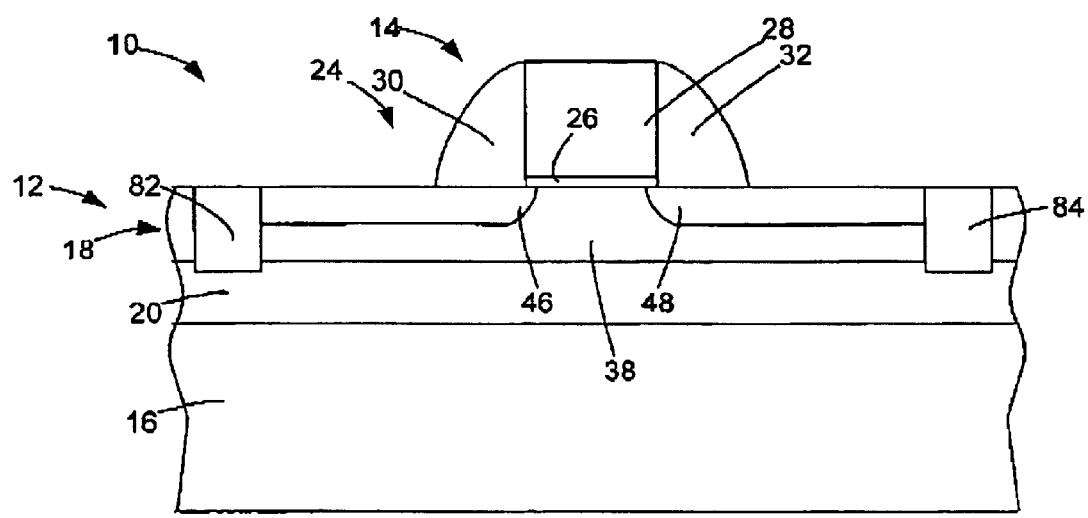
Figure 6:
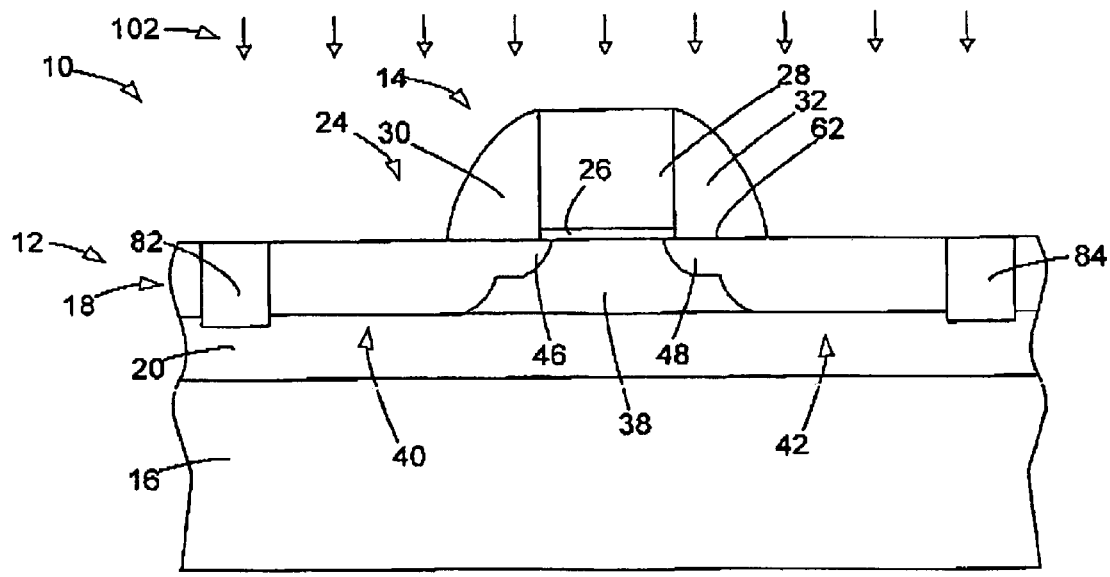

Thereafter, as illustrated in FIGS. 4–6, well-known suitable means are employed for formation of the source 40 and the drain 42. Portions of the silicon on opposing sides of the channel regions that are not masked by the gate 22 then may be doped by ion implantation to produce the source 40 and the drain 42. Such doping may be formed in a two-step implantation process, with a low-energy implant 100 (FIG. 4) to create the extensions 46 and 48, followed by formation of the spacers 30 and 32 (FIG. 5), and then a high-energy implant 102 (FIG. 6) to create the remainder of the source 40 and the drain 42. The region of the semiconductor layer 18 underneath the gate is protected from both implants, by the gate material.

There are many well-known efforts to form the spacers 30 and 32. An exemplary method is to deposit a conformal dielectric layer (e.g., SiN) on the SOI wafer 12 and on the gate 22. Parts of the dielectric layer are then selectively removed to leave respective gate source-side and drain-side spacers 30 and 32. The deposit of the dielectric material and its selective removal may be accomplished by conventional means, for example chemical vapor deposition (CVD) such as LPCVD or plasma enhanced chemical vapor deposition (PECVD), of silicon nitride, followed by anisotropic etching using suitable, well-known etchants, exemplary etchants being freons and their derivatives.

Alternatively, suitable tilted implants may be used to form the source extension 46 and the drain extension 48.

Figure 7:
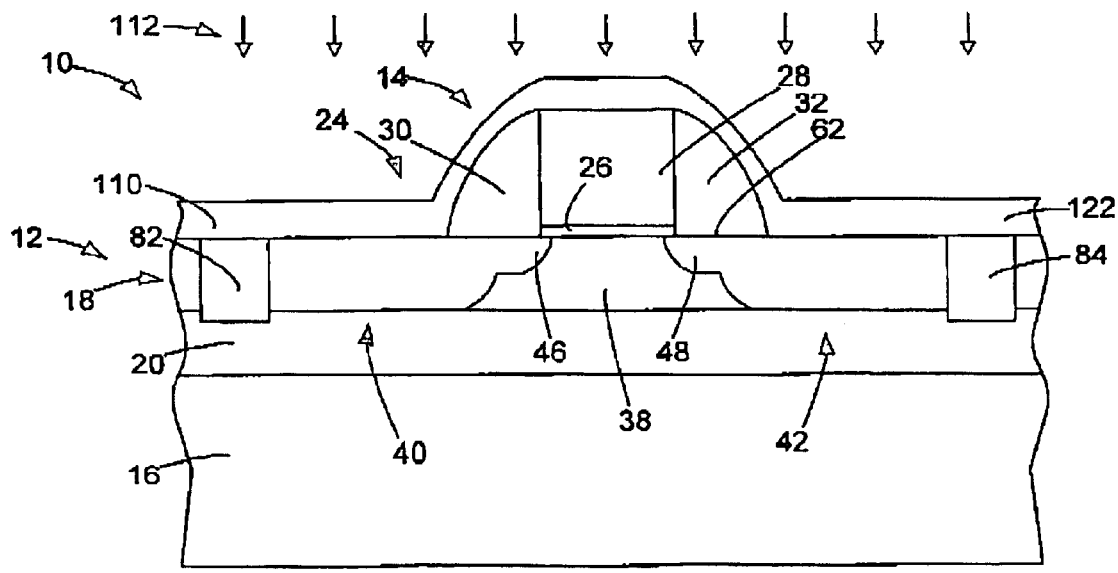

Turning now to FIG. 7, a semiconductor material layer 110 is deposited on the exposed surfaces of the SOI wafer 12, the gate 22, and the spacers 30 and 32. The semiconductor material layer 110 is deposited by a directional deposition method, such as by a collimated sputtering 112. Collimated sputtering involves interposing a collimator between a magnetron cathode and the item to be sputtered. The collimator may be a metal structure with holes or openings therethrough which collects atoms traveling laterally to the item to be sputtered. Thus only atoms traveling in a desired direction or range of directions (e.g., substantially perpendicular to the item to be sputtered) are allowed to pass through the collimator. Alternatively, directionality may be achieved by other methods such as long throw sputtering.

The semiconductor material layer 110 may be composed of the same material as the material of the active layer 24 (e.g., silicon). It will be appreciated that the depth of the semiconductor material layer 110 will be nonuniform due to the directional nature of the deposition. Thus the semiconductor material layer 110 will be thicker in parts overlying the source 40, the drain 42, and the gate 22, than in regions overlying the spacers 30 and 32. The depth of the parts of the semiconductor material layer 110 overlying the source 40, the drain 42, and/or the gate 22, may be between 100 and 1000 Å (Angstroms).

Figure 8:
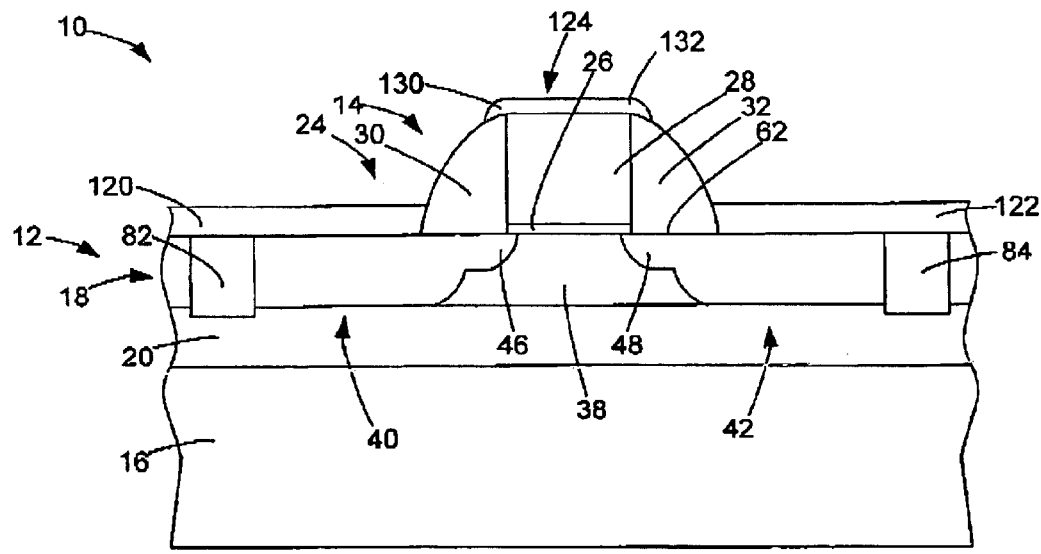

Following the deposit of the semiconductor material layer 110, portions of the layer are selectively removed, as illustrated in FIG. 8. The selective removal uncovers portions of the spacers 30 and 32, dividing the layer 110 into a source-side slab 120, a drain-side slab 122, and a gate slab 124. The gate slab 124 may include tip portions 130 and 132 that overlie the spacers 30 and 32, respectively.

The selective removal may be accomplished, for example, by isotropic etching, such as an isotropic wet etching process using a suitable etchant. An example of a suitable etchant for silicon is a mixture of hydroflouric, nitric, and acetic acids. It will be appreciated that other suitable isotropic etching processes, such as dry etching, may alternatively be utilized.

Figure 9:
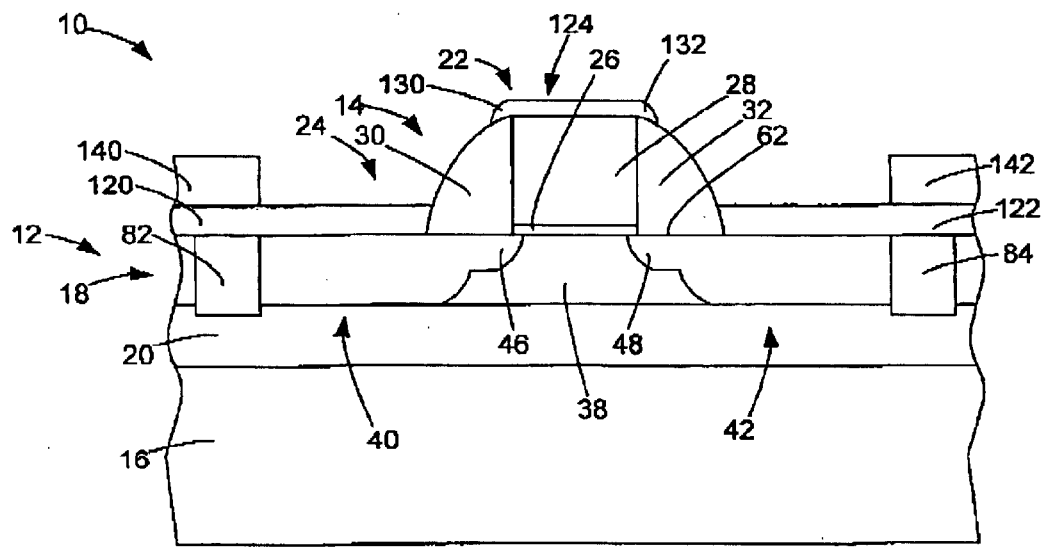

Referring to FIG. 9, mask elements 140 and 142 are formed, to shield the underlying portions of the source-side and drain-side slabs 120 and 122 during the subsequent formation of the metal-semiconductor compounds. The mask elements 140 and 142 may be formed by well-known methods, such as involving photolithography of a suitable resist material.

Figure 10:
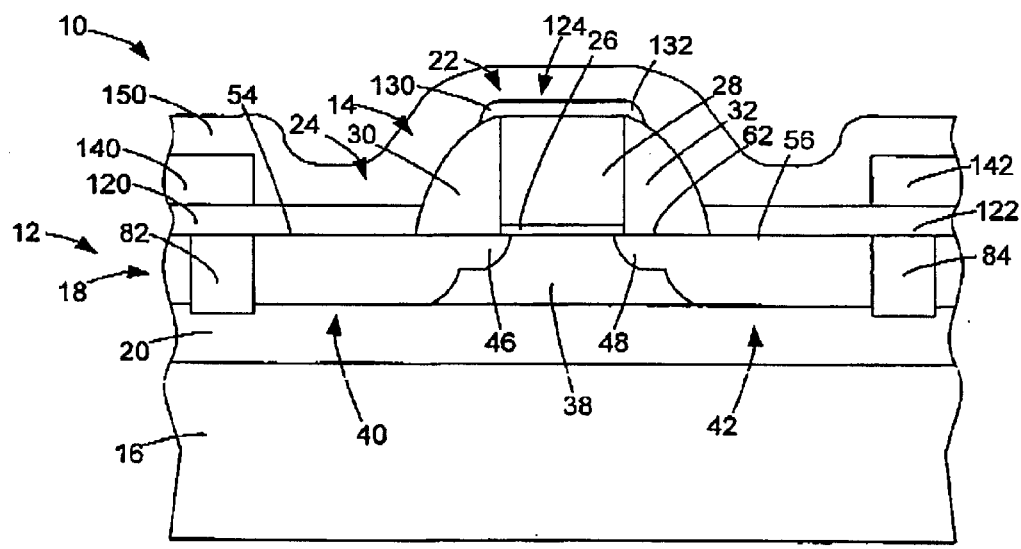
Figure 11:
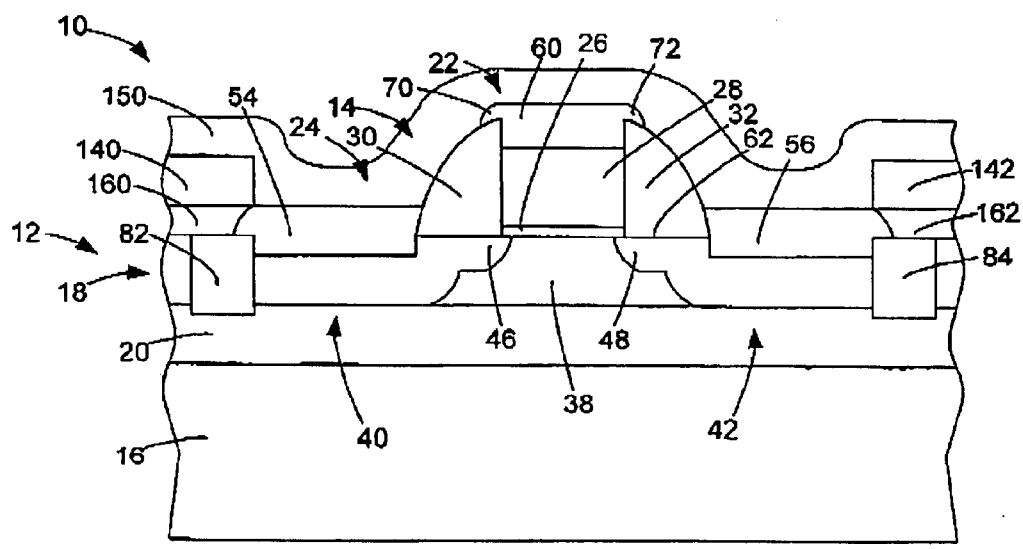

Turning now to FIGS. 10 and 11, the metal-semiconductor compound regions are formed. As shown in FIG. 10, a metal layer 150 is deposited on the exposed surfaces of the device. The metal layer may be of a metal such as titanium, cobalt, or nickel, which is suitable for forming a conducting compound, such as a silicide, with the semiconductor material. The metal layer may be deposited, for example, by sputtering.

Then, as illustrated in FIG. 11, a compound such as a silicide is formed between the metal of the metal layer 150 and the exposed portions of the source 40, the drain 42, and the gate electrode 28, thus producing the metal-semiconductor compound regions 54, 56, and 60. Suitable methods for formation of such electrically-conducting compounds (e.g., silicidation) are well known, an exemplary method being raising temperature of the semiconductor device 10 to a suitable level for a suitable length of time (annealing). An exemplary temperature is between about 400 and 700° C., and an exemplary suitable length of time is between 10 seconds and 10 minutes. Rapid thermal annealing (RTA) may also be employed, for example subjecting the semiconductor device 10 to a temperature between 400 and 900° C. for about 5 to 120 seconds. It will be appreciated that other temperatures and heating times may be employed.

Finally, excess metal of the metal layer is removed by conventional, well-known means. Suitable well-known means may also be employed to remove the mask elements 140 and 142, and the remaining portions 160 and 162 of the deposited semiconductor layer. Thus the device shown in FIG. 1 is produced.

It will be appreciated that the above-described structure and method are only exemplary, and that many suitable variations may be employed. For example, the semiconductor material may be silicon or another suitable semiconductor material, for example involving a material such as germanium. It may be possible to substitute oxides for nitrides, and/or vice versa, in the above structure and/or in the above fabrication method.

Some of the above-described method steps may be omitted or altered, if suitable. For example, the formation of the mask elements 140 and 142 may be omitted if desired. As another example, the shallow trench isolation step may be performed at a different stage during the manufacturing process. As a further example, the steps for forming the source and drain may be simplified, for example performed in a single implant. It will be appreciated that other suitable modifications of the above-described method are possible.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making a semiconductor device comprising:
    forming a structure including a source region and a drain region in a surface semiconductor layer of the device, and a gate and a pair of spacers on the surface semiconductor layer, wherein the spacers on respective opposite sides of the gate, and wherein the gate is operatively coupled to the source region and the drain region;
    directionally depositing semiconductor material on the gate, the spacers, and on exposed portions of the source region and the drain region, wherein the semiconductor material is thicker on the gate and on the exposed portions of the source region and the drain region than on the spacers; and
    selectively removing the semiconductor material to uncover at least part of each of the spacers, the selectively removing leaving a source-side slab of the semiconductor material overlying the source, and a drain-side slab of the semiconductor material overlying the drain.

2. The method of claim 1, wherein the directionally depositing includes depositing the semiconductor material using collimated sputtering.

3. The method of claim 1, wherein the directionally depositing includes depositing the semiconductor material to a thickness of 100 to 1000 Å (Angstroms) in portions of the semiconductor material overlying the source region and the drain region.

4. The method of claim 1, wherein the selectively removing includes back etching the semiconductor layer.

5. The method of claim 4, wherein the back etching includes isotropic etching.

6. The method of claim 5, wherein the isotropic etching includes wet etching.

7. The method of claim 1, wherein selectively removing also leaves a gate slab of the semiconductor material at least partially overlying the gate.

8. The method of claim 7, wherein the gate slab extends beyond edges of the gate.

9. The method of claim 1, further comprising forming a source metal-semiconductor compound region which is electrically coupled to the source region, and a drain metal-semiconductor compound region which is electrically coupled to the drain region, wherein the source metal-semiconductor compound region includes at least part of the source-side slab, and wherein the drain metal-semiconductor compound region includes at least part of the drain-side slab.

10. The method of claim 9, wherein the forming the metal-semiconductor compound regions includes depositing a metal layer, and annealing the device to induce combination of the slabs and the metal layer.

11. The method of claim 1, wherein the forming the structure includes:
   forming a gate on the surface semiconductor layer;
   forming a source extension and a drain extension on respective opposite sides of the gate;
   forming the spacers on opposite sides of the gate; and
   forming the source region and the drain region.

12. The method of claim 11, wherein the forming the spacers includes depositing a layer of insulating material, and isotropically etching the layer of insulating material.

13. A method of making a semiconductor device comprising:
   forming a structure including a source region and a drain region in a surface semiconductor layer of the device, and a gate and a pair of spacers on the surface semiconductor layer, wherein the spacers on respective opposite sides of the gate, and wherein the gate is operatively coupled to the source region and the drain region, the forming including:
      forming a gate on the surface semiconductor layer;
      forming a source extension and a drain extension on respective opposite sides of the gate;
      forming the spacers on opposite sides of the gate; and
      forming the source region and the drain region;
   directionally depositing semiconductor material on the gate, the spacers, and on exposed portions of the source region and the drain region, wherein the semiconductor material is thicker on the gate and on the exposed portions of the source region and the drain region than on the spacers; and
   selectively removing the semiconductor material to uncover at least part of each of the spacers, the selectively removing leaving a source-side slab of the semiconductor material overlying the source, a drain-side slab of the semiconductor material overlying the drain, and a gate slab of the semiconductor material at least partially overlying the gate.

14. The method of claim 13, wherein the directionally depositing includes depositing the semiconductor material using collimated sputtering.

15. The method of claim 13, wherein the directionally depositing includes depositing the semiconductor material to a thickness of 100 to 1000 Å (Angstroms) in portions of the semiconductor material overlying the source region and the drain region.

16. The method of claim 13, wherein the selectively removing includes isotropically etching the semiconductor layer.

17. The method of claim 16, wherein the isotropic etching includes wet etching.

18. The method of claim 13, wherein the gate slab extends beyond edges of the gate.

19. The method of claim 13, further comprising, subsequent to the selectively removing, forming a source metal-semiconductor compound region which is electrically coupled to the source region, and a drain metal-semiconductor compound region which is electrically coupled to the drain region, and a gate metal-semiconductor compound region which is electrically coupled to the gate, wherein the source metal-semiconductor compound region includes at least part of the source-side slab, wherein the drain metal-semiconductor compound region includes at least part of the drain-side slab, and wherein the gate metal-semiconductor compound region includes at least part of the gate slab.

20. The method of claim 19, wherein the forming the metal-semiconductor compound regions includes depositing a metal layer, and annealing the device to induce combination of the slabs and the metal layer.

21. A method of making a semiconductor device comprising:
   forming a structure including a source region and a drain region in a surface semiconductor layer of the device, and a gate and a pair of spacers on the surface semiconductor layer, wherein the spacers on respective opposite sides of the gate, and wherein the gate is operatively coupled to the source region and the drain region;
   collimated sputtering semiconductor material on the gate, the spacers, and on exposed portions of the source region and the drain region, wherein the semiconductor material is thicker on the gate and on the exposed portions of the source region and the drain region than on the spacers;
   isotropically etching the semiconductor material to uncover at least part of each of the spacers, the selectively removing leaving a source-side slab of the semiconductor material overlying the source, a drain-side slab of the semiconductor material overlying the drain, and a gate slab of the semiconductor material at least partially overlying the gate;
   depositing a metal layer; and
   annealing the device to induce formation of semiconductor-metal compound regions at intersections of the slabs and the metal layer;
   wherein the depositing the metal layer and the annealing occur after the isotropically etching.

22. The method of claim 1, wherein the selectively removing includes reducing thickness of parts of the semiconductor material overlying the gate and overlying the exposed portions of the source region and the drain region.

23. The method of claim 22, wherein the selectively removing includes isotropic wet etching of the semiconductor material.

24. The method of claim 10, wherein the depositing and the annealing occur subsequent to the selectively removing the semiconductor material.

25. The method of claim 13, wherein the selectively removing includes reducing thickness of parts of the semiconductor material overlying the gate and overlying the exposed portions of the source region and the drain region.

26. The method of claim 25, wherein the selectively removing includes isotropic wet etching of the semiconductor material.

27. The method of claim 21, wherein the selectively removing includes reducing thickness of parts of the semiconductor material overlying the gate and overlying the exposed portions of the source region and the drain region.

28. The method of claim 27, wherein the selectively removing includes isotropic wet etching of the semiconductor material.

* * * * *

UNITED STATES PATENT AND TRADEMARK OFFICE
CERTIFICATE OF CORRECTION

PATENT NO. : 6,743,666 B1
DATED : June 1, 2004
INVENTOR(S) : Chan

It is certified that error appears in the above-identified patent and that said Letters Patent is hereby corrected as shown below:

Column 3,
Line 60, replace "suicide" with -- silicide --.

Signed and Sealed this

Thirtieth Day of November, 2004

JON W. DUDAS
*Director of the United States Patent and Trademark Office*